United States Patent [19]

Knödler et al.

[11] Patent Number: 5,122,635

[45] Date of Patent: Jun. 16, 1992

[54] LASER SOLDERING SYSTEM FOR SMD-COMPONENTS

[75] Inventors: Dieter Knödler, Eschenbach; Werner Möller, Ulm; Kai-Uwe Vayhinger, Hochdorf, all of Fed. Rep. of Germany

[73] Assignee: Messerschmitt-Bolkow-Blohm GmbH, Fed. Rep. of Germany

[21] Appl. No.: 619,970

[22] Filed: Nov. 30, 1990

[30] Foreign Application Priority Data

Dec. 1, 1989 [DE] Fed. Rep. of Germany ....... 3939812

[51] Int. Cl.⁵ ............................................. B23K 26/00
[52] U.S. Cl. ............................. 219/121.63; 219/121.78
[58] Field of Search ..................... 219/121.63, 121.64, 219/121.78

[56] References Cited

U.S. PATENT DOCUMENTS 4,845,335  7/1989  Andrews et al. ............... 219/121.63
5,021,630  6/1991  Benko et al. ................... 219/121.64

FOREIGN PATENT DOCUMENTS 0168605  4/1989  European Pat. Off. .
3701013  7/1988  Fed. Rep. of Germany .

Primary Examiner—C. L. Albritton
Attorney, Agent, or Firm—Evenson, Wands, Edwards, Lenahan & McKeown

[57] ABSTRACT

The invention relates to a CW-Nd:YAG Laser soldering system for SMD-components by means of which the soldering may be shortened by the simultaneous feeding of solder, multiple radiation, ER-absorber, flux or reaction gas, and an optimizing of the Z-adjustment of the laser spot or spots and the laser power per soldering point can be controlled. Embodiments are explained and are illustrated schematically in the figures of the drawing.

18 Claims, 4 Drawing Sheets

LASER SOLDERING SYSTEM FOR SMD-COMPONENTS

BACKGROUND AND SUMMARY OF THE INVENTION

The invention relates to a laser soldering system for SMD-components.

A system of this type, which operates according to the single-beam method by means of a CW-Nd:YAG Laser and comprises a control device for the rate of change of the temperature, has become known from the DBP 37 012 013 and the EP 0 168 605. The latter system operates by means of an X-Y table and can be moved only in these two axes. The laser spot and the radiation surface as well as the laser power per soldering point are constant; only the laser power intensity is variable. Very narrow temperature—time tolerances must be maintained during laser soldering; specifically the time must be minimal; the temperature must be only barely above the melting point of the solder, but below the disintegration temperature of the substrates and mainly below the thermal damaging of the component, in the present case, predominantly SMD's. The soldering time of the above-mentioned system amounts to over 0.1 sec. per soldering point and, in the case of circuits with high-poled components or numerous soldering points, comes close to the soldering time of the simultaneous die soldering method and reflow strip soldering method. A similar situation exists in the embodiment according to the U.S. Pat. No. 4,845,335.

It is an object of the present invention to provide a system of the initially mentioned type in which the soldering times are shortened so significantly that also high-poled components (SMD's) and circuits with many components may be subjected to an economical laser soldering. Very brief soldering times with correspondingly high laser powers, in order to avoid overheating, require temperature controls as well as an optimizing of the Z-adjustment of the laser lens system and of the radiation surface so that the laser power can be controlled for each soldering point.

This object is achieved according to the invention by a laser soldering system having two computer controlled robotic devices wherein the power of the laser source and its vertical positioning as well as a filler wire advance system are adjustable to control the soldering process.

Other objects, advantages and novel features of the present invention will become apparent from the following detailed description of the invention when considered in conjunction with the accompanying drawings.

DETAILED DESCRIPTION OF THE DRAWINGS

Figure 1:
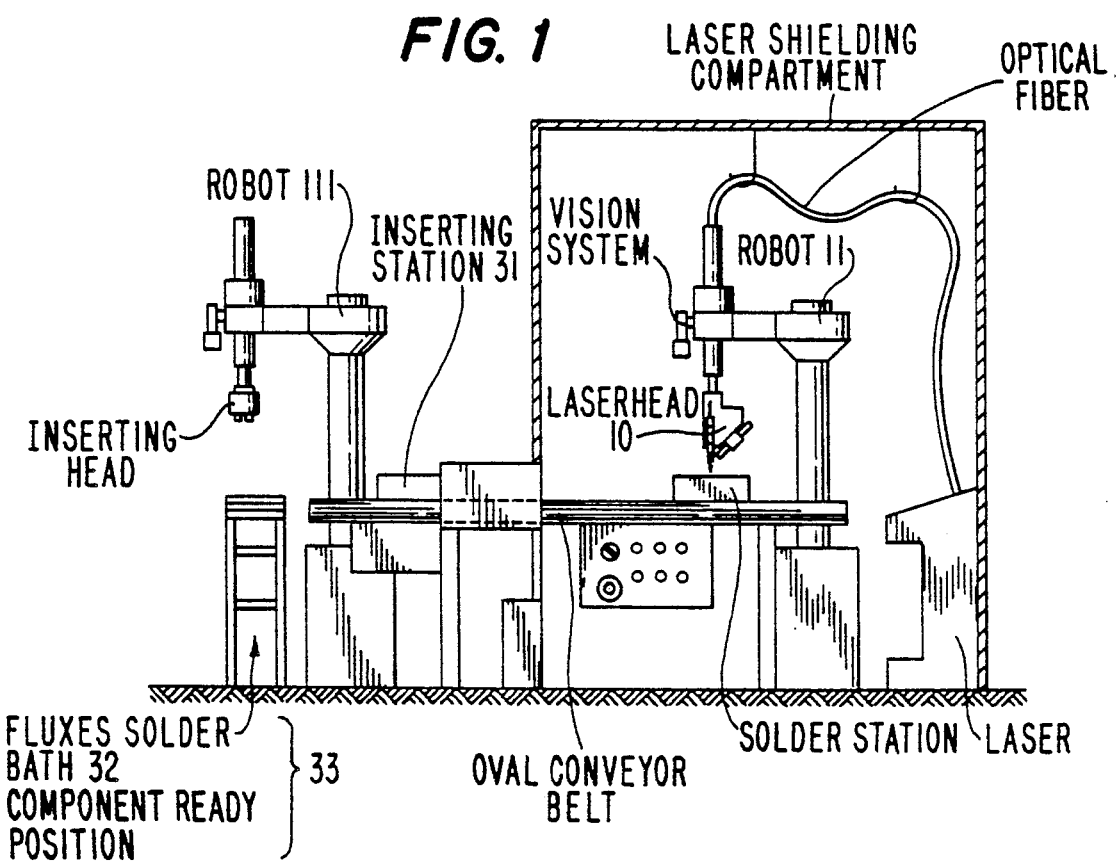
FIG. 1 is a schematic outline of a complete laser soldering system, in one embodiment, comprising a first and a second robot.
Figure 2:
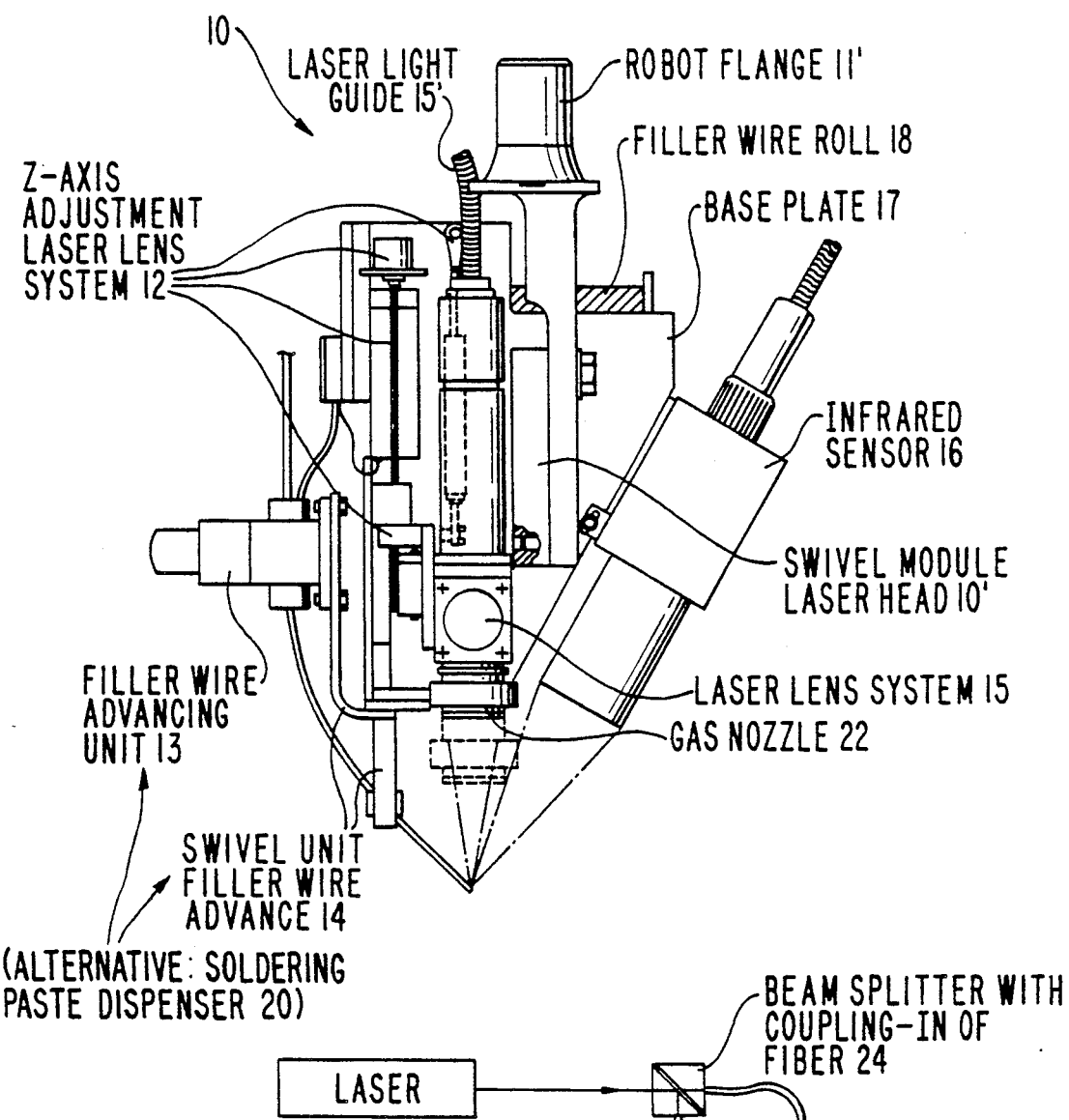
FIG. 2 is a view of the laser head arranged on a robot flange and conceived as a pivotable module laser head.

FIG. 1 is a schematic representation of the embodiment of a robot laser soldering system which corresponds to the suggested laser soldering system. This system essentially comprises a first and a second robot 11, 111. The first robot 11, by means of the robot flange 11', is equipped with a so-called laser head 10 which, according to the embodiment of FIG. 2, is preferably constructed as a pivotable module laser head 10'. In this case, the modules, which will be listed individually in the following, are fastened on a base plate 17 and are in an operative connection with one another. Primarily, this is a computer-controlled filler wire advancing device 13 which is constructed as a module. As a result of the integration of this device 13 into the soldering operation by means of controlling the operation of the robot laser soldering system, it is not only made possible to shorten the process but, by means of the computer control, an improvement of the reproduceability and reliability is also achieved.

Figure 5:
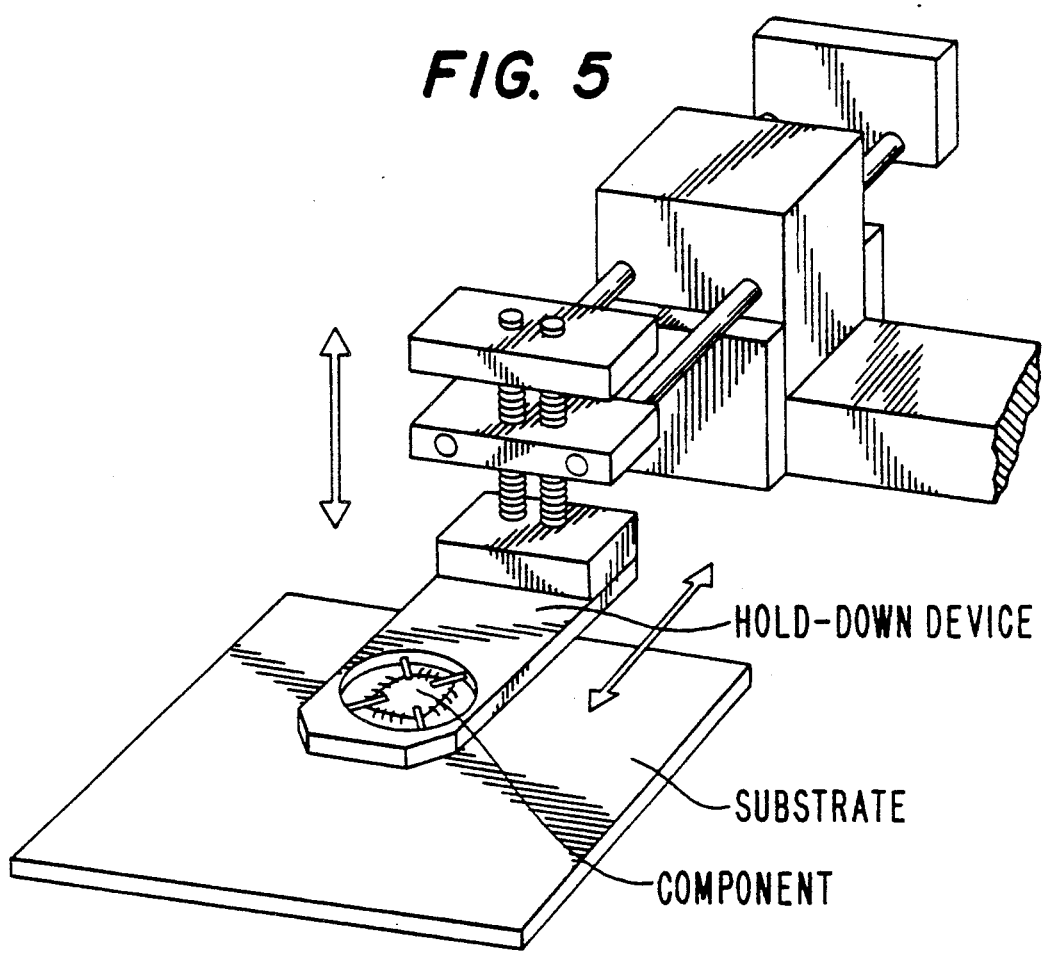
FIG. 5 is a schematic outline of the component hold-down device in an embodiment with a spring steel cross, a spring steel spider or a spring steel frame.

The preliminary solder feeding takes place by means of a computer-controlled filler wire and solder paste dispenser 20 which is operated by means of the same, parallel-offset position data, controls and devices—as described above. The dispenser 20 is characterized in that it operates by means of the same software, computer formation and positioning as the CW-Nd:YAG Laser. This laser, by means of the laser light guide 15', is connected with the laser head 10. The same method of operation—thus, software, computer formation and position like the laser—also applies to the fully integrated component inserting device 31 and takes place after the passage of an oval conveyer belt by means of a gripper exchange and is connected with the laser soldering process. In this case, the term "components" preferably relates to the SMD-components (Surface Mounted Device) $K_1$, $K_2$... The inserting device 31 is part of the second robot 111. The placing of the SMD's may also take place according to the TAB method (Tape Automated Bonding). According to this method, the components are precisely positioned on an 8-mm, 16-mm or 35-mm roll film, are tested and are punched out only before the soldering on the circuit. The components or SMD's are preferably, before the soldering, in an intermediate step, immersed with the connections in a special flux paste or solution. This flux solution absorbs the laser light, dries fast and contain a low-evaporating solvent. Suggested fluxes are, for example, 5 to 30% nigrosine or colophonium solutions Immediately after the immersion, the SMD's are placed on the circuit (FIG. 5) and pressed on during the soldering process. This prevents that the SMD "floats" on the solder which frequently occurs in the case of cold printed circuit boards.

In the case of thin wire connections, as they are customary in the case of TAB-SMD's, the component connections may be pressed on by means of a female-mold-type quartz glass die and be laser-soldered because quartz glass can be penetrated by the laser beam. In particular, ring-shaped holding devices made of high-melting metals have been found to be suitable for the pressing-on of the connections.

The flux and the resulting time-consuming cleaning will not be necessary if a forming gas consisting of 10% $H_2$ and 90% $N_2$ is blown at the soldering point and an atmosphere is provided that is reducing in the laser torch. The blowing of forming gas takes place pneumatically only during the short laser pulse so that, in the case of sensorily controlled circulating air or suction intake, there is no risk of explosion. This also has the effect of driving-out the moisture, the flux and the soldering vapors and also avoids the misting of the IR and laser lens systems. Instead of forming gas, nitrogen gas, which was previously rinsed with a solution of methanol and formic acid in a so-called "washing bottle", may also be used.

Figure 3:
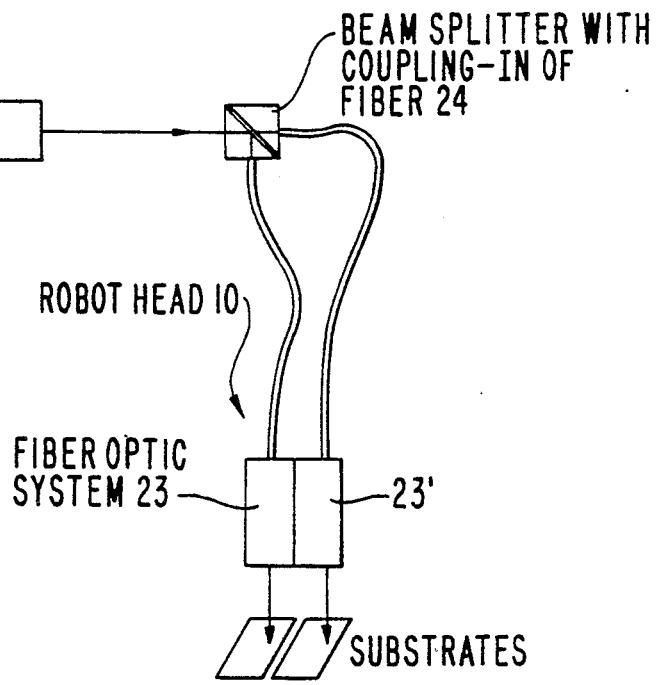
FIG. 3 is a schematic outline of an embodiment for the simultaneous soldering of two components by means of two fiber optic devices.

In a special embodiment (FIG. 3, FIG. 4), the soldering operation, for the purpose of manufacturing, may therefore be doubled and the manufacturing time may be reduced if, by way of a beam splitter 24, two fiber optic systems 23, 23′ are connected to the laser, and—for example, in the case of panel substrates—two circuits (strip conductor and contact) $K_1$, $K_2$ may be soldered simultaneously in the same manner. The individual process steps may be carried out by means of a single robot arm, and the positioning assignment may be facilitated by means of a coupled vision system or image analysis system. As a result, the robot system is better utilized, and the arrangements become simpler.

The image analysis system operates in a known manner according to the known state of the art so that no further explanations are necessary.

Figure 4:
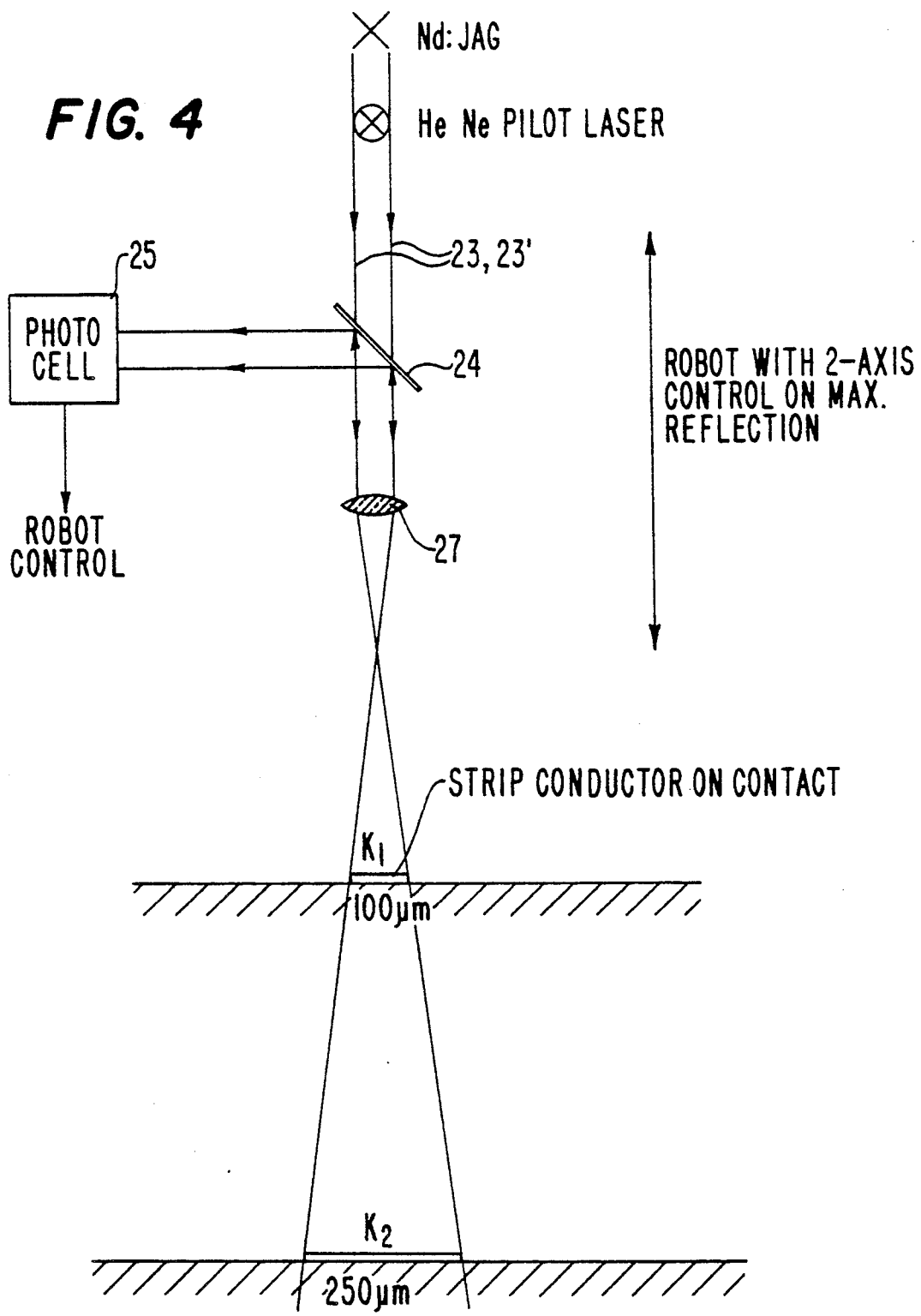
FIG. 4 is a schematic outline of the guiding of the laser beam in the embodiment according to FIG. 3 for a robot with a two-axis control for maximal reflection.

A further shortening and optimizing of the temperature-time sequence is achieved by an adaptation of the laser spot to the soldering point geometry in that the Z-position of the laser lens 27 or of the laser head 10 is changed by a Z-axis adjusting device 12 by means of the robot control (FIG. 4). It is known that the geometries of the SMD-components vary considerably and require a certain adaptation. The focussing laser beam 23 and 23′ clearly changes its surface in the Z-direction. By means of a controlled laser power change, the radial intensity is adapted or the soldering time, in addition, is therefore also changed. This laser power change is also programmed by means of a PC.

The optimizing of the Z-adjustment may take place according to the so-called double-beam principle by means of measuring the luminous intensity. In the case of all soldering lasers operating with a mirror system, this geometric adaptation so far has not been possible and neither has been an automatic filler wire feeding.

The embodiment of a swivel module laser head 10′ illustrated in FIG. 2 of the drawing comprises several modules arranged on a base plate. It primarily comprises the module of the laser lens system 15 with the laser light guide 15′; furthermore the connectable and adjustable infrared sensor 16; the module of the filler wire advancing device 13 to which a swivel unit 14 is assigned; and a filler wire race 18 which can be unwound. Another module forms the Z-axis adjusting device 12 for the laser lens system. The base plate or module support plate 17 is fastened to the robot flange 11′. The individually mentioned electronic systems of the mentioned modules are also connected with the robot or robots 11, 111 or their computer and control units.

Figure 6:
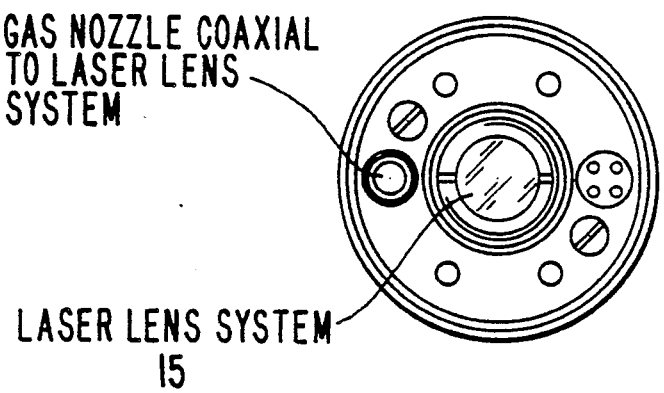
FIG. 6 is a schematic outline of the laser lens system having an integrated coaxial gas nozzle.

FIG. 6 is a schematic representation of the laser head 10 with the computer-controlled filler wire or solder paste dispenser 20. Also shown is the arrangement of the IR-sensor 16 for the laser temperature/time control as well as of the computer-controlled motor for the feeding of the filler wire 13 with the laser lens system 15, the gas nozzle 22 or nozzles for the forming gas and the filler wire reserve.

Finally the preliminary feeding of solder will be described which may also be carried out by means of the above-described laser soldering systems. A preliminary feeding of solder to the strip conductors and the SMD's by means of device 32 of the second robot 111 in a sufficient layer thickness results in the first shortening of time. A preliminary supply of solder to the substrate or to the component connections galvanically, in the soldering bath or by means of filler wire results in a direct rapid soldering without the requirement of an additional feeding of solder as a punched part, a paste or a wire.

Another type of the preliminary feeding of solder takes place by a preliminary feeding of fine wire strands which applies so-called soldering peaks, for example, to IC's for the TAB process. These soldering peaks can be calibrated or levelled by means of a temperature-defined die. In the case of the TAB process, the thermomode may be used which is customary in this case.

The device 33 for the fluxing corresponds to the arrangement which is customary in soldering systems (roller, brush, sponge roller).

Although the invention has been described and illustrated in detail, it is to be clearly understood that the same is by way of illustration and example, and is not to be taken by way of limitation. The spirit and scope of the present invention are to be limited only by the terms of other appended claims.

We claim:

1. Laser soldering system for Surface Mounted Device-components using a CW-Nd:YAG Laser having a temperature and time control and monitoring device as well as a temperature gradient control, wherein control devices for a laser spot, a radiation surface and the laser power for soldering points are mounted on and cooperate with a laser head of a first multiaxis robot and, in addition, a computer-controlled filler wire advancing device and its process control device are integrated in said first laser head, and wherein a second multiaxis robot, is controlled to operate in cooperation with the first multiaxis robot and comprises means for the inserting components to be soldered, for preliminary supplying of solder to said components and for the fluxing, and only three-axis to six-axis positioning systems are used for the laser soldering process.

2. A laser soldering system according to claim 1, wherein the laser head is constructed as a swivel module laser head.

3. A laser soldering system according to claim 2, wherein a computer-controlled dispenser for one of: filler wire and soldering paste, laser lens systems and gas nozzles for a forming gas are mounted with the laser head.

4. A laser soldering system according to claim 3, wherein said dispenser operates with the same computer formation and positioning as the CW-Nd:YAG Laser.

5. A laser soldering system according to claim 4, wherein the filler wire is transported through a capillary tube, is positioned and is melted off by the laser beam.

6. A laser soldering system according to claim 5, wherein said means for inserting of the second multiaxis robot is positioned in front, relative to a direction of movement of said components, of the laser soldering operation of the first multiaxis robot, and is coupled by way of a gripper exchange.

7. A laser soldering system according to claim 6, wherein the component connections, by means of the component inserting device, are one of: coated with a layer absorbing the laser light, and surface treated.

8. A laser soldering system according to claim 7, wherein the components to be soldered, with their connections, before the inserting and soldering, are immersed into a fast-drying or low-evaporating flux solution which absorbs the laser light and during the soldering are pressed on by means of a die.

9. A laser soldering system according to claim 6, wherein 5 to 30% nigrosine or colophonium solutions are used as the light-absorbing solution.

10. A laser soldering system according to claim 9, wherein the component connections are pressed on by means of a quartz glass die.

11. A soldering system according to claim 10, wherein the components to be soldered, during the soldering, are pressed on by means of a spring steel spider which diagonally recesses the connections.

12. A laser soldering system according to claim 11, wherein during the soldering operation, a blowing of protective gas or forming gas takes place by way of one or several gas nozzles under the control of an $H_2$-sensor.

13. A laser soldering system according to claim 12, wherein the protective or forming gas is moistened or rinsed by means of methanol/-formic acid in a "washing bottle".

14. A laser soldering system according to claim 13, wherein the blowing of forming gas takes place pneumatically only during the duration of the laser soldering pulse.

15. A laser soldering system according to claim 14, wherein for the simultaneous soldering of two components, two fiber optic systems, by way of a beam splitter, are coupled with the CW-Nd:YAG Laser and, possibly by way of a photocell, are coupled with the robot control, the robot 11 having a two-axis control for maximal reflection.

16. A laser soldering system according to claim 15, wherein for the adaptation of the laser spot to the soldering point geometry, the laser lens or the laser head are constructed to be slidable or pivotable in the Z-direction by means of an adjusting device by way of the robot control.

17. A laser soldering system according to claim 16, wherein the radial intensity of the laser and thus the soldering time can also be varied by way of a laser power measuring and adjusting device and a PC programming device.

18. A laser soldering system according to claim 17, wherein a swivelling unit is assigned to the filler wire advancing device.

* * * * *